(12) United States Patent
Fukuchi

(10) Patent No.: US 7,776,703 B2
(45) Date of Patent: Aug. 17, 2010

(54) PROCESS FOR MANUFACTURING SEMICONDUCTOR DEVICE

(75) Inventor: Kazuhiro Fukuchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/277,533

(22) Filed: Nov. 25, 2008

(65) Prior Publication Data
US 2009/0148997 A1    Jun. 11, 2009

(30) Foreign Application Priority Data
Dec. 6, 2007    (JP)    ............................. 2007-316217

(51) Int. Cl.
*H01L 21/331*    (2006.01)
*H01L 21/8222*    (2006.01)
(52) U.S. Cl. .................. 438/311; 438/106; 438/463; 438/782; 257/E21.005; 257/E21.006; 257/E21.007; 257/E32.134; 257/E21.347
(58) Field of Classification Search .............. 438/311, 438/106, 463, 459, 487, 535, 686, 688, 780, 438/782; 257/E21.005, E21.007, E21.006, 257/E21.032, E32.134, E21.347
See application file for complete search history.

(56) References Cited

U.S. PATENT DOCUMENTS

| 6,143,587 | A | 11/2000 | Omizo | |
|---|---|---|---|---|
| 6,692,978 | B2 * | 2/2004 | Tandy et al. | .................. 438/26 |
| 6,734,032 | B2 * | 5/2004 | Tandy et al. | .................. 438/26 |
| 7,094,618 | B2 * | 8/2006 | Tandy et al. | .................. 438/26 |
| 7,238,543 | B2 * | 7/2007 | Tandy et al. | .................. 438/26 |
| 2002/0192572 | A1 * | 12/2002 | Lau | ............................. 430/5 |
| 2006/0079011 | A1 * | 4/2006 | Tandy et al. | .................. 438/14 |

FOREIGN PATENT DOCUMENTS

| JP | 11-347755 | 12/1999 |
|---|---|---|
| JP | 2001-044304 | 2/2001 |
| JP | 2004-311552 | 11/2004 |

OTHER PUBLICATIONS

Chinese Patent Office issued a Chinese Office Action dated Jan. 8, 2010, Application No. 200810179491.5.

* cited by examiner

*Primary Examiner*—David Nhu
(74) *Attorney, Agent, or Firm*—Young & Thompson

(57) ABSTRACT

Reduction of damage to a semiconductor device due to a marking process while inhibiting deterioration of a mark can not be achieved in conventional processes for manufacturing semiconductor devices. A process for manufacturing the semiconductor device 100 involves irradiating the marking film 21 with an energy beam through the transparent protective film 31 after the protective film 31 is formed, and such irradiation causes a chemical modification of the material of the marking film 21 to create the marks. According to the above-described process for manufacturing the semiconductor device 100, the region for the marking or the upper surface of the marking film 21 is sheathed by the protective film 31, so that a damage to the semiconductor chip 11 due to the generations of dust, exothermic heat, gas, stress or the like during the marking operation can be reduced. This allows achieving the process for manufacturing the semiconductor device 100 that provides a manufacture of better quality of the marks.

18 Claims, 7 Drawing Sheets

PROCESS FOR MANUFACTURING SEMICONDUCTOR DEVICE

This application is based on Japanese patent application NO. 2007-316,217, the content of which is incorporated hereinto by reference.

BACKGROUND

1. Technical Field

The present invention relates to a process for manufacturing a semiconductor device.

2. Related Art

In a semiconductor device such as, for example, chip scale package (CSP) and the like, which includes an external connector terminal to be connected to a base substrate which is formed in a side of a circuit surface of a semiconductor chip where the whole semiconductor chip is not covered with a plastic package, a marking surface of the CSP is a surface of the semiconductor chip opposite to the circuit surface thereof, or in other words a back surface of the semiconductor chip.

In such back surface of the chip of such semiconductor device, markings indicating information such as a name of a product, an index mark, a date of manufacture, a lot number, characteristic rank or the like are made by utilizing ink, laser beam or the like. In recent years, a laser marking process becomes mainstream for the marking process, because of improved productivity and the recent trend of concern for the environment, and a need for such laser marking process, which achieves less damage to the semiconductor substrate and better visibility, is increased.

Japanese Patent Laid-Open No. 2001-44,304 describes an enhancement of visibility for marked letters by pre-coating a resin film over a back surface of a semiconductor wafer serving as a marking surface via a spin coating process and partially baking such resin film by laser beam to achieve a marking. Japanese Patent Laid-Open No. 2001-44,304 also describes that laser beam partially reaches the metal portion through the resin film during the cutting with a laser beam.

Japanese Patent Laid-Open No. 2004-311,552 discloses that a mark is formed in a second principal surface opposed to a surface for forming an electrode in a semiconductor device via an etching process without employing laser beam and then a transparent resin layer is formed over the second principal surface and an upper surface of the marking.

However, the present inventor has found that the technology described in Japanese Patent Laid-Open No. 2001-44,304 causes a deterioration of a function for the protective film because the mark is made on the protective film, and also causes a deterioration of the mark because the mark is exposed. Further, the technology also causes a dusting and a generation of exothermic heat from the protective film during the marking process, causing problems of damaging the peripheral protective films or devices. On the other hand, since the technology described in Japanese Patent Laid-Open No. 2004-311,552 involves forming the marking via the etching process, an additional operation for forming an etching mask is required.

SUMMARY

According to one aspect of the present invention, there is provided a process for manufacturing a semiconductor device, including: sequentially forming a first film and a second film over a substrate; and applying an energy beam over the first film through the second film so that the first film is modified by the applied energy beam to create a mark.

In the process for manufacturing the semiconductor device, the second film is formed and then the first film is irradiated with an energy beam through the transparent second film, so that the material of the first film is modified to create a mark without marking in the second film. Since the material of the first film is partially modified to create a mark in the condition where the first film is covered with the second film that is transparent to the energy beam according to such process for manufacturing the semiconductor device, an influence to the circumferences due to the generations of dust, heat or the like caused during the marking process can be reduced. Further, since the first film, which is suitable for the marking with an energy beam, is employed in the present invention, easily-identified marking can be achieved.

According to the present invention, a process for manufacturing the semiconductor device, which provides a reduced deterioration of the mark and a reduced damage to the semiconductor device caused by the marking process, can be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments of the present invention of processes for manufacturing the semiconductor devices will be described below, in reference to the annexed figures. In all figures, an identical numeral is assigned to an element commonly appeared in the figures, and the detailed description thereof will not be repeated.

FIRST EMBODIMENT

Figure 1A:
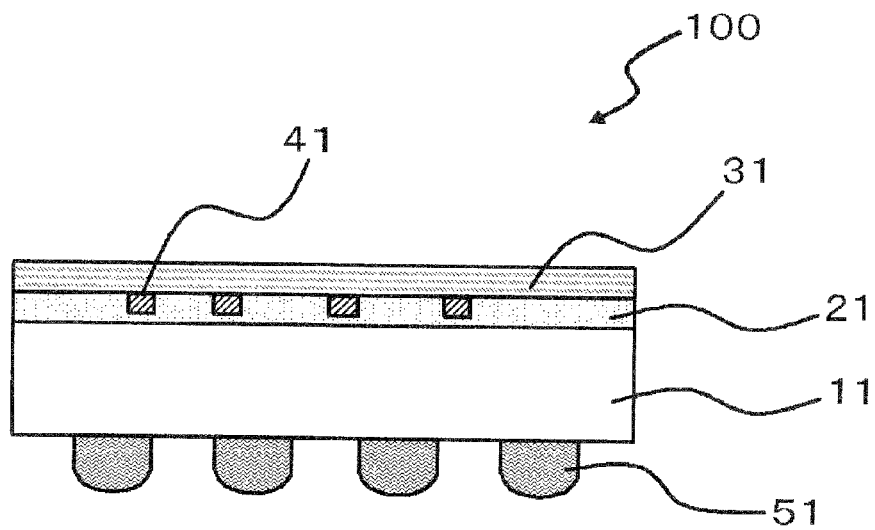
FIG. 1A is a cross-sectional view and FIG. 1B is a perspective view, both illustrating an embodiment of a process for manufacturing a semiconductor device according to the present invention.
Figure 1B:
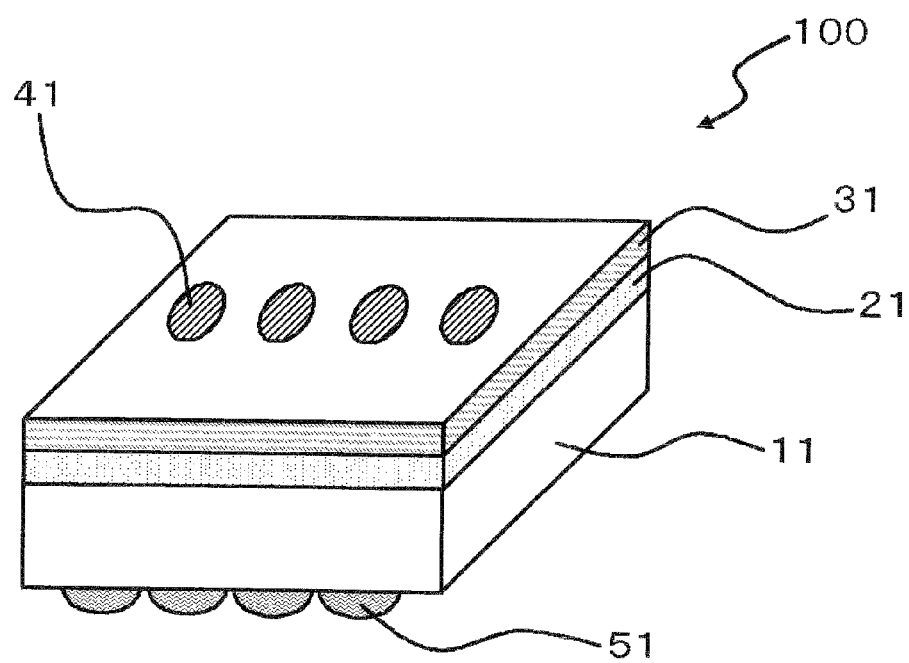

FIG. 1A is a cross-sectional view and FIG. 1B is a perspective view, both illustrating first embodiment of a process for manufacturing a semiconductor device according to the present invention. A semiconductor device 100 includes a semiconductor chip 11, a marking film 21 (first film) formed on the semiconductor chip 11, a protective film 31 (second film) formed to cover the marking film 21 and marks 41 created by partially modifying a material of the mark film 21 formed on the marking film 21.

The mark 41 means symbols, signatures or the like, which are formed during an operation or a work for marking. For example, the marks include a name of a product, an index mark, a date of manufacture, a lot number, characteristic rank or the like. The marks 41 may be visible by eyes through the protective film 31 or may be identifiable via an equipment such as a camera, an optical sensor and the like. FIG. 1B illustrates a condition, where the marks are visible through the transparent protective film 31.

The semiconductor chip 11 has a first principal surface and a second principal surface in the opposing side of the first principal surface. A semiconductor device and a circuit patterns which are not shown, are formed, in the first principal surface, and external coupling terminals 51 composed of solder or the like are formed thereon. The semiconductor chip 11 is coupled to a base substrate through the external coupling terminals 51.

The semiconductor chip 11 is, for example, made of silicon.

The marking film 21 (first film) is formed on the second principal surface of the semiconductor chip 11. The marks 41 are formed in the upper portion of the marking film 21. Materials, which are capable of absorbing energy beam such as laser beams and the like and of being partially modified to create the mark 41, may be employed for a material of the marking film 21. For example, materials, which are capable of absorbing light having a wave length of about 1 μm such as yttrium-aluminum-garnet (YAG) laser beam, fiber-amplified ytterbium (FAYb) laser beam and the like and of being modified to create the mark 41, may be easily obtainable. For example, materials containing metallic materials such as aluminum, nickel, molybdenum, chromium and the like, black colored materials such as carbon black and the like, which are capable of easily absorbing light having a wave length of about 1 μm, are suitable. These are the materials that are commercially available at lower cost. More specifically, the available materials typically include a metallic film or an alloy film containing at least one of aluminum, nickel, molybdenum and chromium, or a material composed of a resin such as epoxy resin or the like containing at least one of the above-described metallic materials and the black colored materials. If the metallic material such as nickel is black colored, efficiency absorbing light is increased.

The protective film 31 (second film) is formed on the marking film 21. Further, the thickness thereof may also be arbitrarily selected. The protective film 31 serves as a protective film for inhibiting deterioration of the marks 41 formed in the marking film 21 and the semiconductor chip 11 and providing a protection over the external environment. Materials available for the protective film 31 is not particularly limited to any specific material, and the protective film 31 is preferably formed by employing a material that is transmissive for an energy beam or more preferably a material that is transparent to an energy beam. For example, resins such as acrylic resins, epoxy resins, polyimide resins and the like may be employed. In particular, polyimide resins exhibit better chemical resistance, and thus the use of polyimide resins provides the semiconductor device that exhibits higher reliability. These resins are, in general, colorlessness-transparent, or light gray, light brown or light yellow. Further, these resins have the property for transmitting laser beam having a wavelength of about 1 μm.

An exemplary implementation of a process for manufacturing the semiconductor device 100 will be illustrated below as an embodiment of the process for manufacturing the semiconductor device according to the present invention, in reference to FIG. 2, FIGS. 3A and 3B, FIGS. 4A and 4B and FIGS. 5A and 5B.

Figure 2:
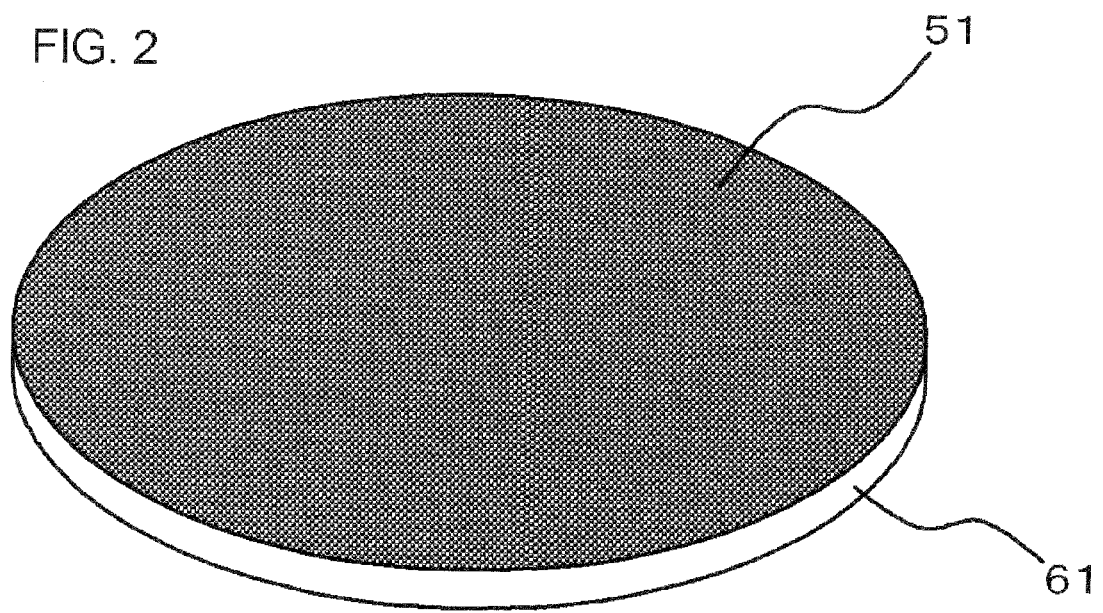
FIG. 2 is a perspective view, illustrating the process for manufacturing the semiconductor device according to the embodiment.

First of all, as shown in FIG. 2, a circuit pattern, which is not shown here, is formed in a first principal surface of a semiconductor wafer 61 via a diffusion process, and then the external coupling terminals 51 are formed.

Next, a second principal surface (back surface of semiconductor wafer 61), which is the opposing side of the first principal surface of semiconductor wafer 61, is ground, so that the semiconductor wafer 61 is shaped to have the required thickness.

Subsequently, the marking film 21 is formed on the back surface of the semiconductor wafer 61. In such case, the marking film 21 is formed by spin-coating a liquid resin, laminating a film-form resin or depositing a metallic material.

Further, the protective film 31 is formed on the marking film 21. In such case, the protective film 31 is formed by spin-coating a liquid resin or laminating a film-form resin.

In this way, the marking film 21 and the protective film 31 are sequentially formed on the back surface of the semiconductor wafer 61. Thereafter, the semiconductor wafer 61 is divided into the semiconductor chips 11 via a dicing process.

The semiconductor chip 11 thus obtained is employed to conduct the measurements of the electrical characteristics and the visual inspection, and then a laser marking process is conducted to obtain the semiconductor device 100 as shown in FIG. 1. The semiconductor device 100 is stored in a carrier tape or a tray, according to the specification of the product.

Figure 3A:
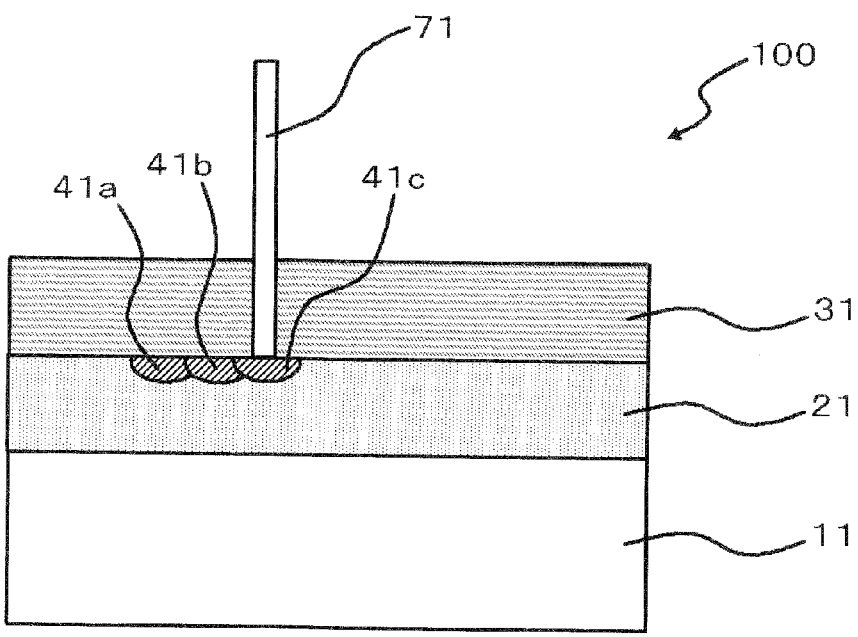
FIG. 3A is a cross-sectional view and FIG. 3B is a plan view, both illustrating the embodiment of the process for manufacturing the semiconductor device.
Figure 3B:
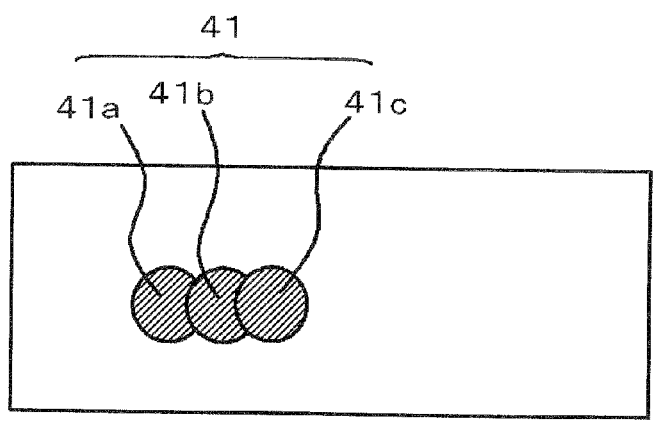

The laser marking process in the present embodiment will be described in detail below. As shown in FIG. 3A, laser beam 71 having a diameter of several tens micrometer and a wave length of 1 μm is emitted from the upside of the semiconductor chip 11 toward the marking film 21 by employing a laser device. The laser beam 71 is transmitted through the protective film 31 to reach the marking film 21. Since the marking film 21 is composed of the material that absorbs the laser beam 71, the laser beam 71 is converted into a heat in the surface of the marking film 21. Such heat partially causes a discolor, a combustion or a melt-solidification in the marking film 21, causing an irregular shaping. More specifically, the portions of the material of the marking film 21 irradiated by the laser beam 71 are modified to form the marks 41. Since the marks 41 are dot-like shaped of several tens micrometers, the marks 41 become to be visible by sequentially creating marks 41a, marks 41b and marks 41c as shown in FIG. 3B and integrating these marks 41. When the material of the marking film 21 is a metallic film, substantially no discoloration or combustion is generated, and a melt-solidification is achieved to deform to an irregular geometry. Since an irregular reflection of the light is occurred due to the irregular geometry, sufficient visibility is ensured without a change of colors. On the other hand, since the protective film 31 is transparent to the laser beam 71, a discoloration or combustion is not caused by the laser beam 71.

Advantageous effect of the present embodiment will be described below. The above-described process for manufacturing the semiconductor device 100 involves irradiating the marking film 21 with an energy beam through the transparent protective film 31 after the protective film 31 is formed, and such irradiation causes a chemical or physical modification of the material of the marking film 21 to create the marks. According to the above-described process for manufacturing the semiconductor device 100, the region for the marking or the upper surface of the marking film 21 is sheathed by the protective film 31, so that a damage to the semiconductor chip 11 due to the generations of dust, exothermic heat, gas, stress or the like during the marking operation can be reduced. This allows achieving the process for manufacturing the semiconductor device 100 that provides a manufacture of better quality of the marks 41.

Further, since the materials suitable for the marking process with an energy beam such as the laser beam 71 and the like may be employed for the marking film 21, the marks 41 with better visibility can be formed. Further, since the laser beam 71 is transmitted through the transparent protective film 31, the marks can be created in the marking film 21 without any damage in the protective film 31. Therefore, unlike the technology described in Japanese Patent Laid-Open No. 2001-44,304, there is no fear to deteriorate the function as the protective film in the case of the protective film 31, without causing any deterioration of the mark 41 or the semiconductor chip 11.

Meanwhile, when the mark 41a, the mark 41b and the mark 41c are consecutively formed as shown in FIGS. 3A and 3B, for example, excessive generation of heat in the overlapped portion of the mark 41a and the mark 41b by the absorption of the laser beam 71 may be caused, and, in turn, an accumulation of heat may be caused in the portion where the marking film 21 is in contact with the protective film 31, possibly causing a discoloration or a deformation of the protective film 31 due to such accumulation of heat. However, even in such case, only the portions of the protective film 31 in contact with the marks 41 or in other words only the internal portions of the protective film 31 are affected by such discoloration or deformation, and absolutely no deterioration is caused, in the side of the surface exposed to the outside, and thus the function as the whole protective film 31 can be maintained.

Figure 4A:
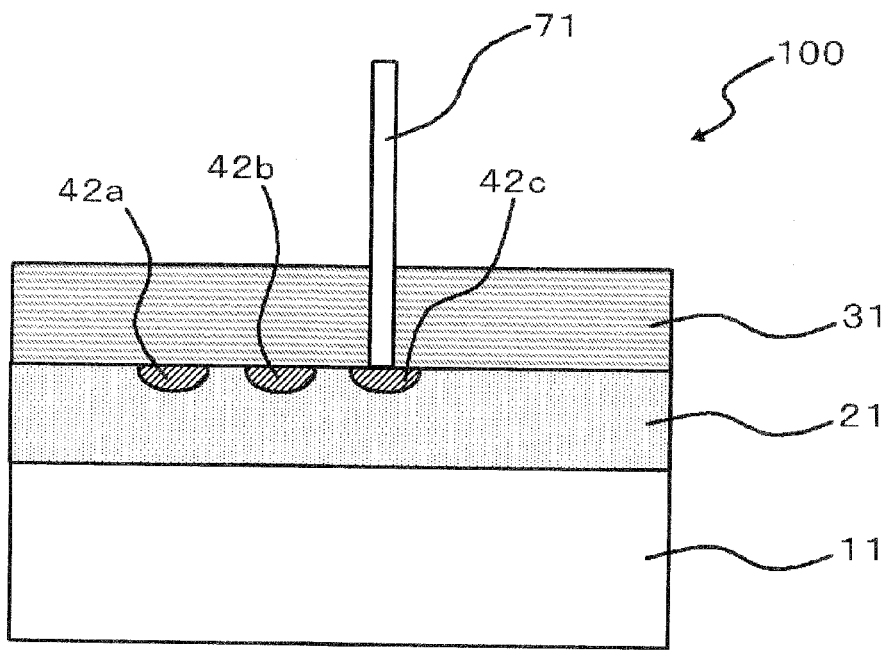
FIG. 4A is a cross-sectional view and FIG. 4B is a plan view, both illustrating the embodiment of the process for manufacturing the semiconductor device.
Figure 4B:
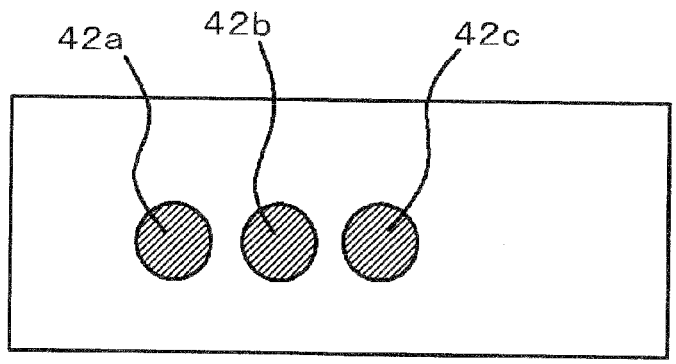

While the exemplary implementation of forming the mark 41a, the mark 41b and the mark 41c to be overlapped has been described in the present embodiment, the marking process may alternatively be conducted so as to provide the mark 41a, the mark 41b and the mark 41c to be spaced apart from each other, as shown in FIGS. 4A and 4B. This configuration allows reducing the damage to protective film 31 from the heat generated by the laser beam 71, even if the protective film 31 is significantly thinner.

Figure 5A:
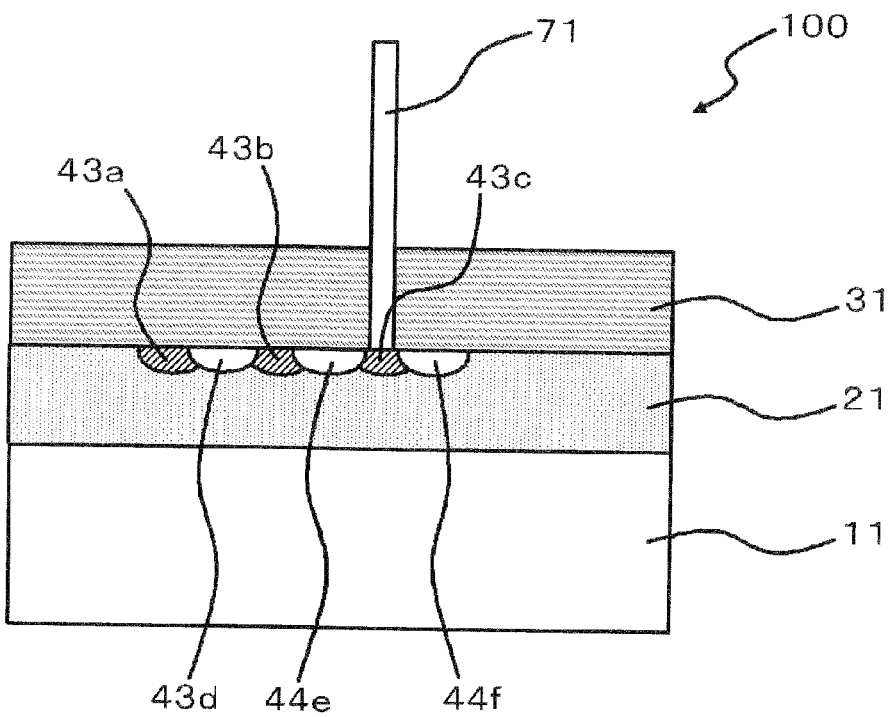
FIG. 5A is a cross-sectional view and FIG. 5B is a plan view, both illustrating the embodiment of the process for manufacturing the semiconductor device.
Figure 5B:
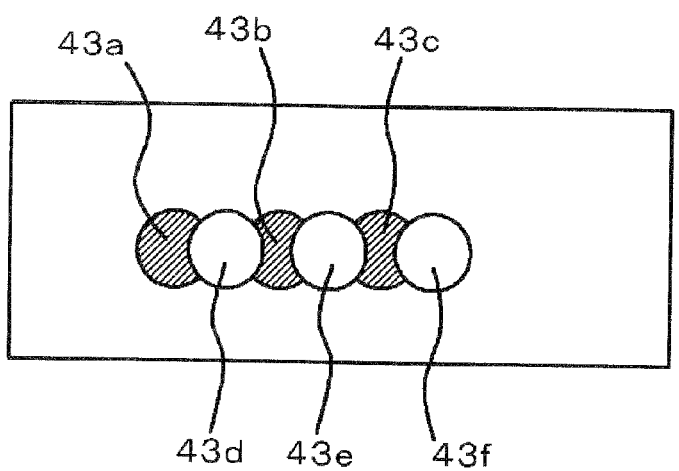

Alternatively, as shown in FIGS. 5A and 5B, the mark 41a, the mark 41b and the mark 41c may be formed to be spaced apart from each other, and then a mark 43d, a mark 43e and a mark 43f may be formed to be disposed therebetween, respectively. This configuration allows providing better visibility of the marks while reducing the damage to protective film 31 from the heat generated by the laser beam 71, even if the protective film 31 is significantly thinner.

Meanwhile, Japanese Patent Laid-Open No. 2001-44,304 describes that a laser marking is conducted for the protective film. Therefore, the material available for the protective film of such conventional technology is limited to materials, which is capable of absorbing a laser beam, combined with having a function for the protective film such as better impact resistance, better chemical resistance, better thermal resistance and the like. Moreover, since deterioration may be caused in the portions of the protective film where the marks are formed, the impact resistance, the chemical resistance, the thermal resistance and the like are deteriorated, possibly causing a deterioration of the semiconductor chip. On the contrary, the material having the property for transmitting the laser beam therethrough is sufficient for the use in the protective film 31 in the present embodiment, and therefore the material having better impact resistance, better chemical resistance and better thermal resistance can be widely selected.

Besides, since the marking is not made in the protective film 31 in the present embodiment, the protective film 31 may have the minimum thickness for serving as the protective film, which leads to a reduction of a warpage of the semiconductor wafer, achieving an increased production yield rate in the manufacturing process, thereby providing an improved processibility. Further, since resins having better chemical resistance such as polyimide and the like can be selected as the material for the protective film 31, larger process tolerance or process window can be utilized, and thus a reduction in the whole production cost and an improvement in the process can be achieved.

While the use of the laser device for emitting the laser beam having a wave length of about 1 μm, which can be employed at relatively lower cost, has been described in the exemplary implementation of the present embodiment, other type of devices, which can emit an energy beam having other wave length, may alternatively be employed, if the materials of the protective film and the marking film are precisely selected.

Further, while the exemplary implementation for conducting the laser marking after the dicing process for obtaining the semiconductor chip 11 has been described in the marking process in the present embodiment, the mark process may alternatively be conducted in the condition of the semiconductor wafer 61 before the dicing process. However, if the information after the dicing, such as the ranking information by the results of the electrical characteristic selection, the information of the final process, the final assembly dates and the like is intended to be marked in this alternative configuration, an additional marking process may be conducted.

SECOND EMBODIMENT

Figure 6:
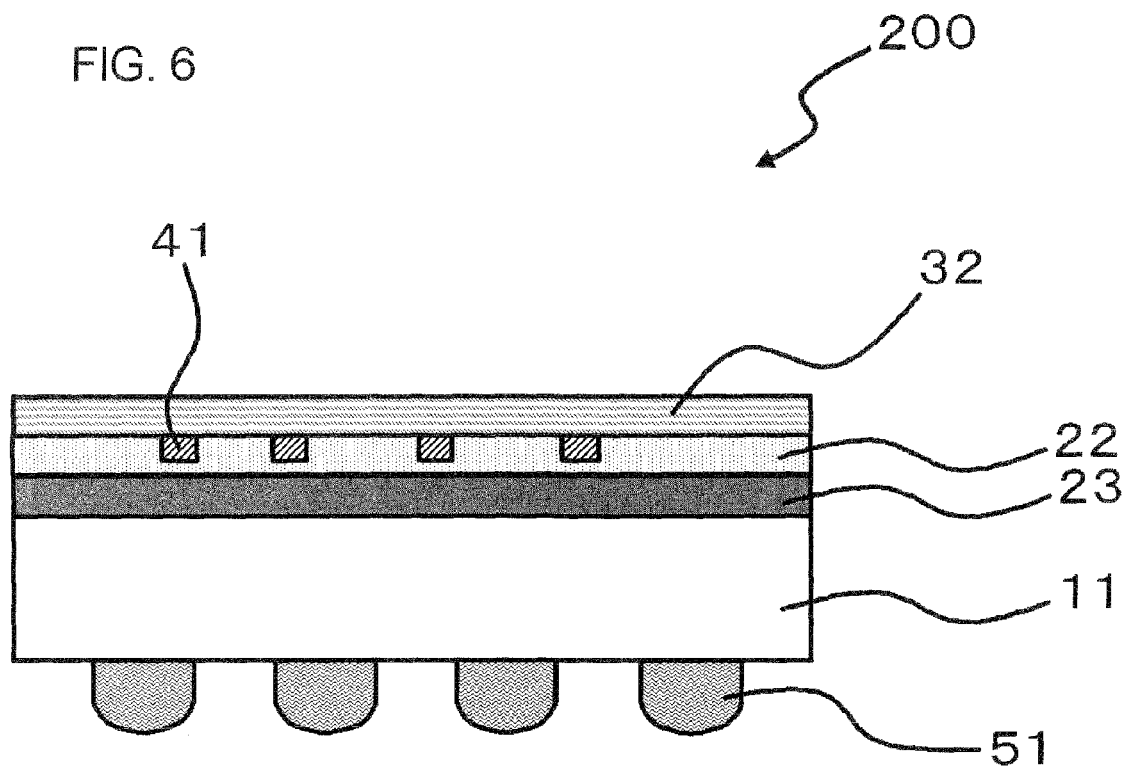
FIG. 6 is a cross-sectional view, illustrating a semiconductor device manufactured via a process for manufacturing a semiconductor device according to another embodiment of the present invention.

FIG. 6 is a cross-sectional view, illustrating second embodiment of a process for manufacturing the semiconductor device according to the present invention. The present embodiment is directed to an exemplary implementation, which further includes a metallic layer 23 (third film) between the semiconductor chip 11 and the marking film 22 (first film).

A semiconductor device 200 has a configuration, in which additionally includes the metallic layer 23 (third film) between the semiconductor chip 11 and the marking film 22 (first film) in the configuration of the semiconductor device 100 of first embodiment, and the marks 41 created by modifying the material of the marking film 22 are formed in vicinity of the upper surface of the marking film 22.

The metallic layer 23 (third film) is formed on the second principal surface of the semiconductor chip 11, and is covered with the marking film 22 (first film). The metallic layer 23 functions as an electrically conducting layer constituting an electric circuit. The metallic layer 23 may also serve a heat-releasing effect. The metallic layer 23 is formed by employing an electroconductive material. Materials having particularly lower electric resistance such as silver, copper and the like are preferable for the material of the metallic layer 23. This allows obtaining enhanced electrical characteristics.

The marking film 22 (first film) is formed so as to cover the metallic layer 23. The marking film 22 functions as a layer that absorbs an irradiated laser beam having a wave length 1 µm. This allows higher flexibility for selecting the material for the metallic layer 23, as metallic materials exhibiting lower reflectivity or lower absorption efficiency for the laser beam having a wave length of 1 µm such as silver and the like may be selected, achieving enhanced electrical characteristics or enhanced heat-releasing effect. The material described above may be employed for the material of the marking film 22. This configuration provides a marking process.

A protective film 32 is utilized similarly as in first embodiment. In the present embodiment, the protective film 32 also has a function of inhibiting a crack or a corrosion of the metallic layer 23.

Figure 7:
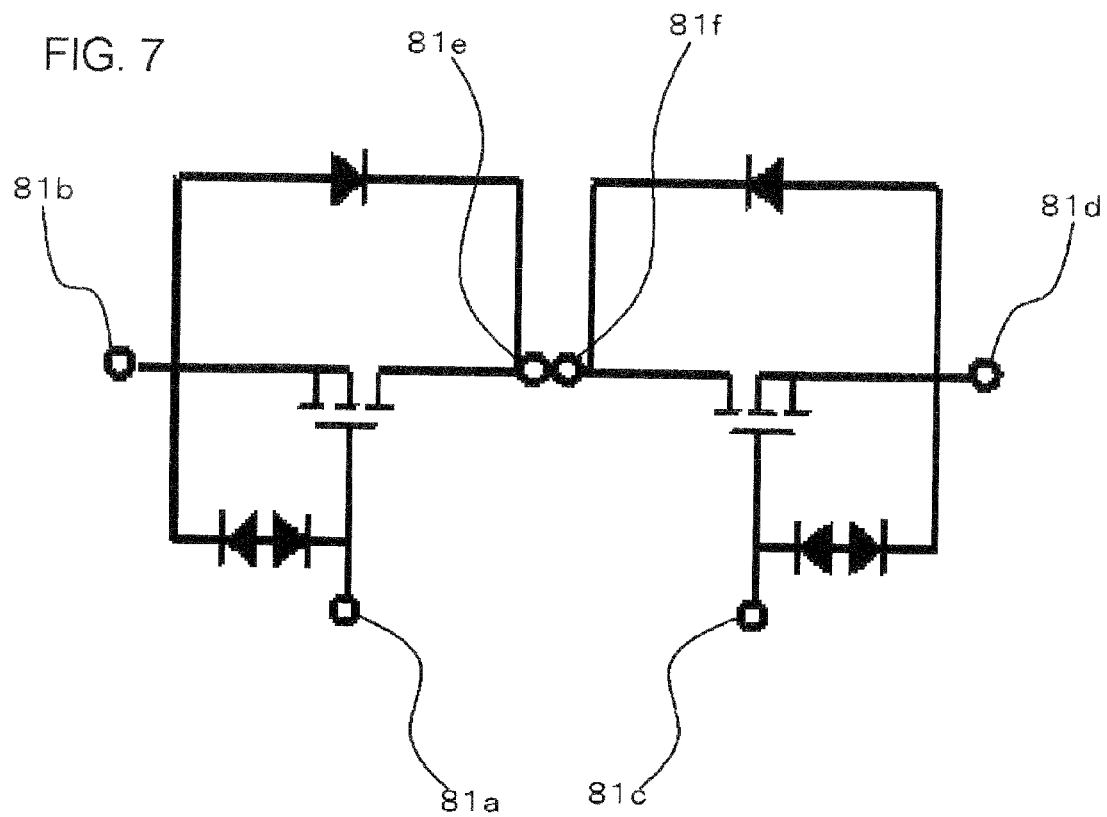
FIG. 7 is a circuit schematic of an electric circuit employed in the semiconductor device, which is manufactured via the process for manufacturing the semiconductor device according to the embodiment.

The semiconductor device 200 may be applied to, for example, a bidirectional switch as shown in FIG. 7. When the configuration of the CSP is employed in the semiconductor device 200, in which two MOSFETs are integrated to a single semiconductor chip, gate terminals 81a and 81c and source terminals 81b and 81d of respective MOSFETs are formed in the side of the circuit-forming surface of the semiconductor chip (first principal surface) and these terminals are coupled to the base substrate, so that the function as the bidirectional switch can be provided. In this case, drain terminals 81e and 81f of two MOSFETs are required to be joined in the interior of the package with lower electric resistance, and the metallic layer 23 serving as an electrically conducting layer is formed in the back surface (second principal surface) of the semiconductor chip 11 that is opposite to the first principal surface of the semiconductor chip 11, which serves as the drain terminals 81e and 81f.

While the semiconductor device 100 of first embodiment involves sequentially forming the marking film 21 and the protective film 31 on semiconductor chip 11, the semiconductor device 200 of the above-described configuration can also be manufactured by the similar process for manufacturing the semiconductor device 100, except that the metallic layer 23 (third film), the marking film 22 and the protective film 32 are sequentially formed on the semiconductor chip 11.

The semiconductor device 200 in the present embodiment may be formed by: forming a circuit pattern that is not shown here, on a first principal surface of the semiconductor wafer 61 via a diffusion process similarly as in first embodiment; and then forming external coupling terminals 51; grinding a second principal surface (back surface of semiconductor wafer 61) that is opposite to the first principal surface of the semiconductor wafer 61 to shape the semiconductor wafer 61 to have the required thickness; and then depositing a metallic film to form the metallic layer 23 on the back surface of semiconductor wafer 61 via a process such as a vacuum deposition process, a vacuum sputter process and the like.

Subsequently, the marking film 22 is formed on the metallic layer 23, similarly as in first embodiment. The marking film 22 in the present embodiment may be formed by depositing a metal such as aluminum, nickel, molybdenum, chromium and the like via a process such as a vacuum deposition process, a vacuum sputter process and the like, or coating or laminating a resin material containing a black colored material such as carbon black and the like. If the marking film 22 is formed of a metallic film, further enhanced electrical characteristics or heat-releasing effect can be achieved.

Since the marking film 22 is formed on the metallic layer 23 even in the semiconductor device that requires the metallic layer 23 in the back surface of the semiconductor chip 11 in the present embodiment, the process for manufacturing the semiconductor device 200 having the marked structure and maintaining the function of the metallic layer 23 as the electric conductor is achieved. Other advantageous effects of the present embodiment are similar to that of the above-described embodiment.

The process for manufacturing the semiconductor device according to the present invention is not limited to the above-described embodiment, and various modifications are also available.

For example, while the configuration of the semiconductor device, which has the semiconductor chip such as CSP that is not covered with a plastic package, has the external coupling terminals in the side of the circuit surface of the semiconductor chip, and the marks are made in the opposite surface thereto, have been described in each of the above-described embodiments, the marking surface is not limited thereto. The present invention may be applied according to applications, characteristics, geometries or the like of semiconductor devices that requires the marking.

It is apparent that the present invention is not limited to the above embodiment, and may be modified and changed without departing from the scope and spirit of the invention.

What is claimed is:

1. A process for manufacturing a semiconductor device, including:
   sequentially forming a first film and a second film over a substrate; and
   applying an energy beam over said first film through said second film so that said first film is modified by the applied energy beam to create a mark, said second film being transparent to said energy beam and being configured to remain on said first film as part of a finished semiconductor device.

2. The process for manufacturing the semiconductor device as set forth in claim 1, wherein said energy beam is a laser beam.

3. The process for manufacturing the semiconductor device as set forth in claim 1, wherein said second film is partially modified in said applying the energy beam.

4. The process for manufacturing the semiconductor device as set forth in claim 1, wherein said first film contains a material having an ability to absorb said energy beam.

5. The process for manufacturing the semiconductor device as set forth in claim 4, wherein said first film contains a metallic material.

6. A process for manufacturing a semiconductor device, including:
   sequentially forming a first film and a second film over a substrate; and
   applying an energy beam over said first film through said second film so that said first film is modified by the applied energy beam to create a mark,
   wherein said first film contains at least one of aluminum, nickel, molybdenum, chromium and black colored material.

7. The process for manufacturing the semiconductor device as set forth in claim 4, wherein said first film contains a black colored material.

8. The process for manufacturing the semiconductor device as set forth in claim 7, wherein said black colored material contains at least one of a black colored metallic material and carbon black.

9. The process for manufacturing the semiconductor device as set forth in claim 1, further comprising forming a third film over said substrate, before said sequentially forming a first film and a second film.

10. The process for manufacturing the semiconductor device as set forth in claim 9, wherein said third film exhibits electroconductivity.

11. The process for manufacturing a semiconductor device as set forth in claim 9, wherein said third film is metallic.

12. A process for manufacturing a semiconductor device, including:
   sequentially forming a first film and a second film over a substrate; and
   applying an energy beam over said first film through said second film so that said first film is modified by the applied energy beam to create a mark in said first film, said second film being transmissive for said energy beam, said second film being configured to remain on said first film as part of a finished semiconductor device.

13. The process for manufacturing a semiconductor device as set forth in claim 12, further comprising forming a third film over said substrate, before said sequentially forming a first film and a second film, said third film being a metallic film.

14. The process for manufacturing the semiconductor device as set forth in claim 5, wherein said metallic material contains at least one of aluminum, nickel, molybdenum and chromium.

15. The process for manufacturing the semiconductor device as set forth in claim 7, wherein said first film is formed by spin-coating liquid resin, laminating a film-form resin or depositing material.

16. The process for manufacturing the semiconductor device as set forth in claim 14, wherein said first film is formed by spin-coating liquid resin, laminating a film-form resin or depositing material.

17. The process for manufacturing the semiconductor device as set forth in claim 6, wherein said black colored material contains at least one of a black colored metallic material and carbon black.

18. The process for manufacturing the semiconductor device as set forth in claim 6, wherein said first film is formed by spin-coating liquid resin, laminating a film-form resin or depositing material.

* * * * *